United States Patent
Kim

[19]

[11] Patent Number: 5,804,501
[45] Date of Patent: Sep. 8, 1998

[54] METHOD FOR FORMING A WIRING METAL LAYER IN A SEMICONDUCTOR DEVICE

[75] Inventor: Jun Ki Kim, Seoul, Rep. of Korea

[73] Assignee: LG Semicon Co., Ltd., Cheongju, Rep. of Korea

[21] Appl. No.: 910,037

[22] Filed: Aug. 12, 1997

Related U.S. Application Data

[63] Continuation of Ser. No. 561,772, Nov. 22, 1995, abandoned.

[30] Foreign Application Priority Data

Nov. 23, 1994 [KR] Rep. of Korea ............... 1994 30901

[51] Int. Cl.$^6$ ................................................. H01L 21/28
[52] U.S. Cl. ...................... 438/627; 438/643; 438/648; 438/680; 438/688
[58] Field of Search ................................ 438/627, 643, 438/648, 680, 688, 350, 352, 354; 104/192.17

[56] References Cited

U.S. PATENT DOCUMENTS

| | | | |
|---|---|---|---|
| 4,970,176 | 11/1990 | Tracy et al. | 437/187 |
| 5,008,217 | 4/1991 | Case et al. | 437/194 |
| 5,171,412 | 12/1992 | Talieh et al. | 204/192.15 |
| 5,266,521 | 11/1993 | Lee et al. | 437/190 |
| 5,371,042 | 12/1994 | Ong | 437/194 |
| 5,380,678 | 1/1995 | Yu et al. | 437/192 |
| 5,420,072 | 5/1995 | Fiordalice et al. | 437/192 |
| 5,545,591 | 8/1996 | Sugai et al. | 437/192 |

FOREIGN PATENT DOCUMENTS

| | | |
|---|---|---|
| 480580 | 4/1992 | European Pat. Off. . |
| 63-131544 | 6/1988 | Japan . |

*Primary Examiner*—John Niebling
*Assistant Examiner*—Thomas G. Bilodeau
*Attorney, Agent, or Firm*—Loudermilk & Associates

[57] ABSTRACT

A method for forming a wiring layer for a semiconductor device is disclosed. During the formation of a VLSI-scale device having a contact hole with a large aspect ratio, metal layers are filled into the contact hole without spatial discontinuities, and a first wiring metal deposition process is carried out by applying a chemical vapor deposition (CVD) process. Compared with a conventional method, even if a thin film of aluminum is deposited, the wiring metal film can be deposited into the contact hole without spatial discontinuities. The upper opening of the contact hole may remain wide after deposition of the first wiring layer, and the wiring metal atoms may easily move into the contact hole upon reaching the wafer during a second wiring metal deposition. The disclosed invention may provide for superior wiring metal filling characteristics as compared with conventional methods. Further, the first wiring metal deposition may be carried out within a short period of time as compared with the conventional method, and the productivity may be improved.

15 Claims, 5 Drawing Sheets

METHOD FOR FORMING A WIRING METAL LAYER IN A SEMICONDUCTOR DEVICE

This application is a continuation of application(s) Ser. No. 08/561,772 filed on Nov. 22, 1995, now abandoned.

FIELD OF THE INVENTION

The present invention relates to methods for forming wiring metal layers in semiconductor devices, and more particularly to methods which are suitable for forming VLSI-scale semiconductor devices having contact holes of high aspect ratio.

BACKGROUND OF THE INVENTION

If individual elements formed on a semiconductor substrate are to be electrically connected to each other or to external signal lines, a wiring metal layer electrically connected to terminals of the individual elements is required. This wiring metal layer typically is made of a low resistivity metal such as aluminum, and has various patterns depending on the connections between the individual elements.

Conventionally, first there is formed a contact hole in an insulating layer which is formed upon the device, and a thin barrier metal layer is formed within the contact hole and upon the insulating layer. Then, a wiring metal such as aluminum is deposited twice so as to form a wiring metal layer of the device.

FIGS. 1a to 1d are sectional views illustrating a conventional method for forming a wiring metal layer for a semiconductor device. Although not illustrated in the drawings, an inter-layer dielectric (ILD) is formed upon the device after formation of elements on a substrate for insulating the elements and the wiring metal layer.

As illustrated in FIG. 1a, contact hole T is formed in inter-layer dielectric 11, in such a manner that contact hole T is connected to the electrode portions of the elements which are formed on substrate 10.

As illustrated in FIG. 1b, a metallic material such as W, TiN, or TiW is deposited thinly on the inside of contact hole T and on inter-layer dielectric layer 11, thereby forming barrier metal layer 13.

As illustrated in FIG. 1c, first Al layer 14 is formed on barrier metal layer 13 at a low temperature to a thickness of 1000–2000 Angstroms at a low deposition speed of less than 100 Angstroms/second.

As illustrated in FIG. 1d, Al is deposited again by application of a sputtering process upon the first Al layer. That is, a second Al layer is formed at a high temperature of 450° C. in such a manner as to fill the interior of the contact hole by increasing the mobility of the Al atoms, thereby completing the formation of wiring metal layer 17.

During the above-described processes, it sometimes happens that a thin Ti film called a wetting barrier is deposited upon the barrier metal prior to depositing the first Al layer, for the purpose of increasing the Al mobility during the second Al deposition. It also frequently happens that a part called a collimator is installed between a target and the semiconductor substrate for improving the advancing direction of the Al atoms from the target to the wafer, and for facilitating uniform deposition of Al within the contact hole during the first Al deposition.

That is, in filling the contact hole with Al during the wiring metal layer forming process, it is important that Al is deposited into the contact hole without spatial discontinuities after depositing of the first Al layer. Conventionally, this was solved by applying a low temperature, low deposition speed method, or by using a collimator to improve the direction of the Al atoms.

With such conventional methods, however, the low deposition speed lowers the productivity. Further, since a sputtering process is used in depositing the Al, the step-coverage is aggravated. Therefore, a spatially-continuous Al layer within the contact hole can be obtained only by depositing the Al to a large thickness, If the Al thickness becomes large, however, the upper opening of the contact hole becomes narrow after the first Al deposition, with the result that the downward movement of the Al atoms is impeded during the second Al deposition.

SUMMARY OF THE INVENTION

The present invention is intended to overcome the above-described disadvantages of the conventional techniques. Therefore, it is an object of the present invention to provide a method for forming a wiring metal layer in a semiconductor device, in which the lowering of productivity due to the low deposition speed is overcome, and the narrowing of the upper opening of a contact hole during a first wiring metal deposition also is prevented.

In achieving the above object, the method for forming a wiring layer in a semiconductor device according to the present invention may include the steps of: depositing an insulating layer upon a semiconductor substrate on which elements have been formed, and defining a contact hole by applying a photo etching process; forming a barrier metal layer by depositing a metallic material such as W, TiN or TiW upon the insulating layer with the contact hole formed therein; forming a first wiring layer in the form of a CVD-metal on the barrier metal layer; and depositing a second wiring metal layer upon the first wiring metal layer at a high temperature, whereby a wiring metal layer for a semiconductor device is formed.

In the method for forming a wiring metal layer for a semiconductor device according to the present invention, the first wiring metal layer is formed by applying a chemical vapor deposition process (CVD). Therefore, even if the first wiring layer is formed to a thin thickness, a spatially-continuous wiring metal film can be formed within the contact hole, and, therefore, the clogging of the upper opening of the contact hole by the first wiring metal layer can be avoided unlike the conventional method.

BRIEF DESCRIPTION OF THE DRAWINGS

The above object and other advantages of the present invention will become more apparent by describing in detail preferred embodiments of the present invention with reference to the attached drawings in which.

DESCRIPTION OF THE PREFERRED EMBODIMENTS

FIGS. 2a–2d are sectional views illustrating the process steps for forming a wiring metal layer in a semiconductor device according to the present invention.

Figure 1A:
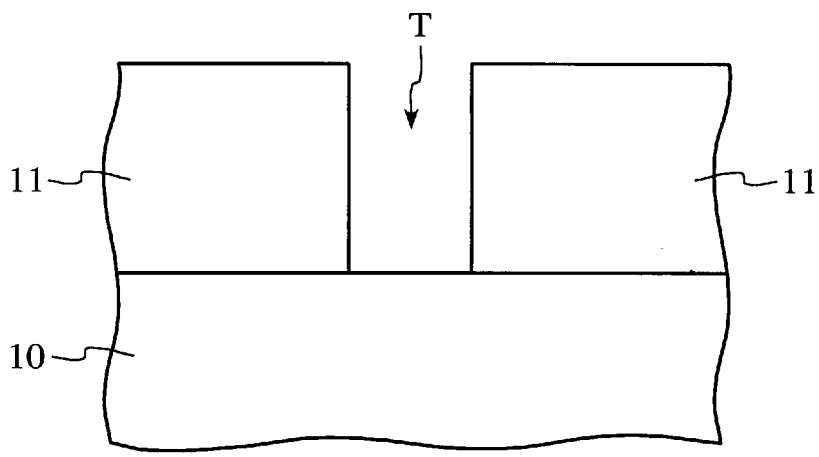
FIGS. 1a–1d illustrate a conventional method for forming a wiring metal layer in a semiconductor device.
Figure 1B:
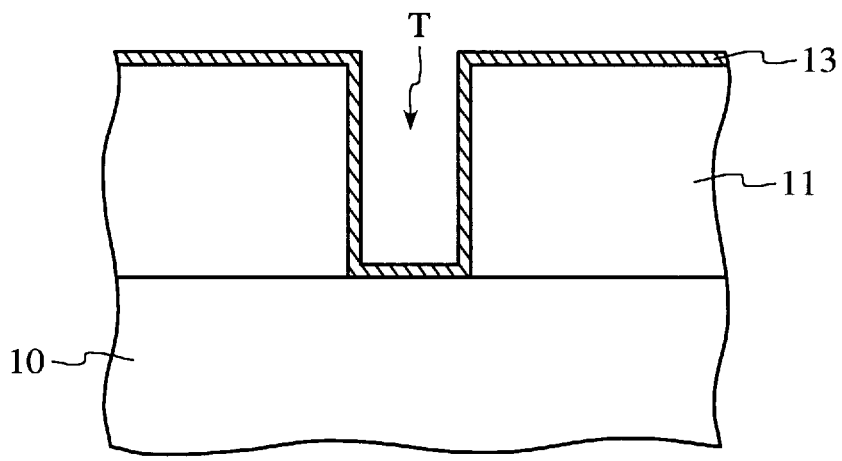
Figure 1C:
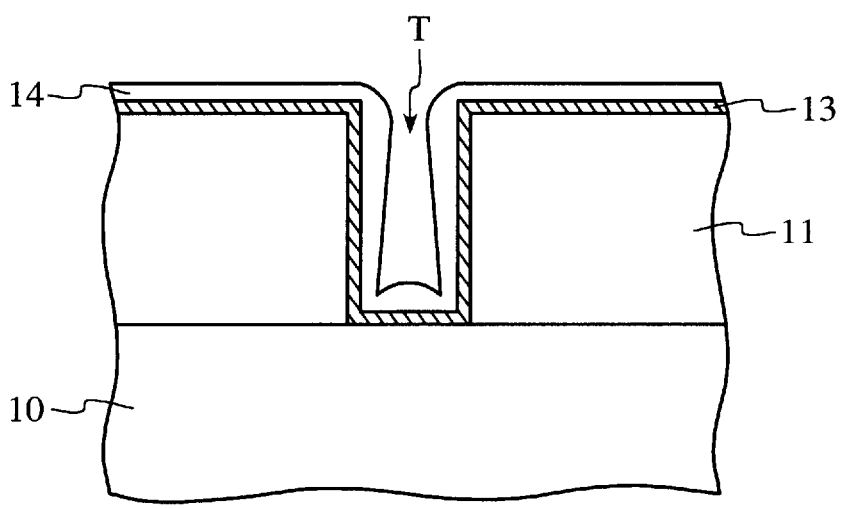
Figure 1D:
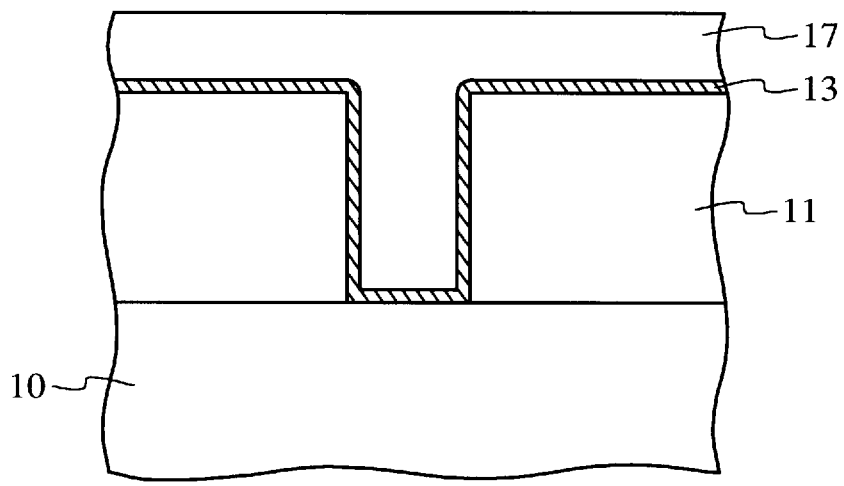
Figure 2A:
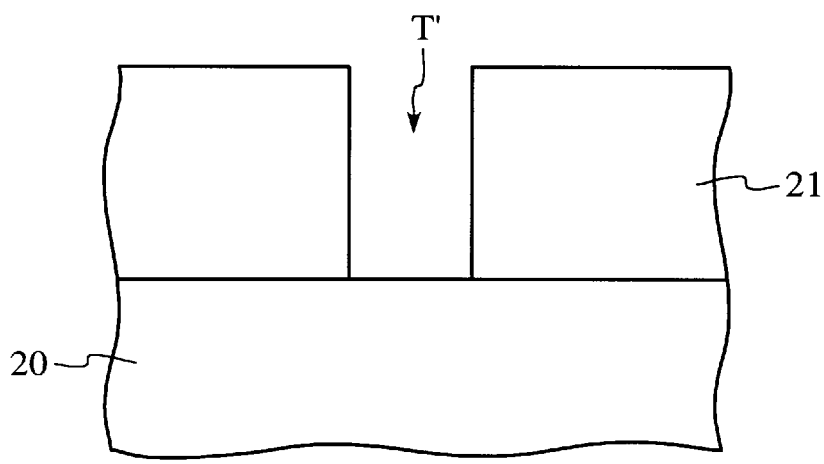
FIGS. 2a–2d illustrate an embodiment of a method for forming a wiring metal layer in a semiconductor according to the present invention.
Figure 2B:
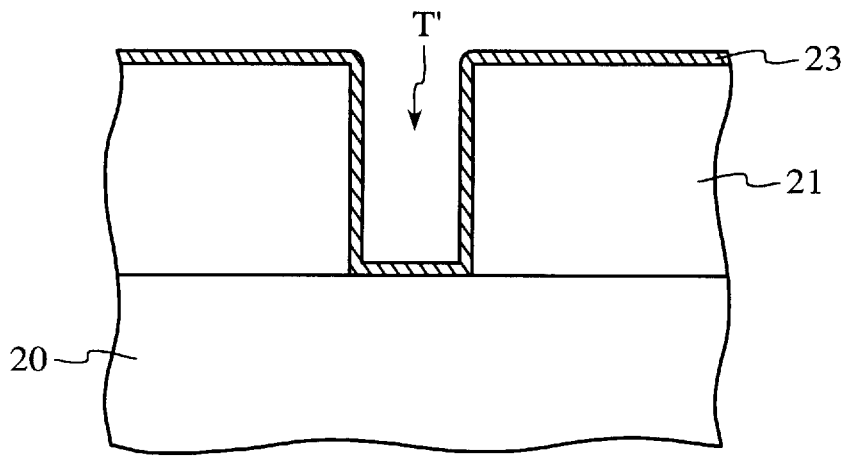

As illustrated in FIG. 2a, inter-layer dielectric 21 is formed on semiconductor substrate 20 on which elements have been formed, and contact hole T' is formed therein. As illustrated in FIG. 2b, barrier metal layer 23 is formed within contact hole T' and on inter-layer dielectric 21. Here, barrier metal layer 23 is composed of titanium (Ti), titanium nitride (TiN), titanium tungsten (TiW) or tungsten (W). After formation of barrier metal layer 23, an annealing is carried out for improving the characteristics of barrier metal layer 23.

Meanwhile, although not illustrated in the drawings, a thin film may be formed on barrier metal layer 23, so that the material of the thin film may react with Al of a wiring layer. This step may raise the mobility of the Al during formation of a first wiring layer, and help in the movement of Al atoms into the contact hole. The material of the thin film for reacting with the Al may be titanium (Ti), silicon (Si), or zinc (Zn).

Figure 2C:
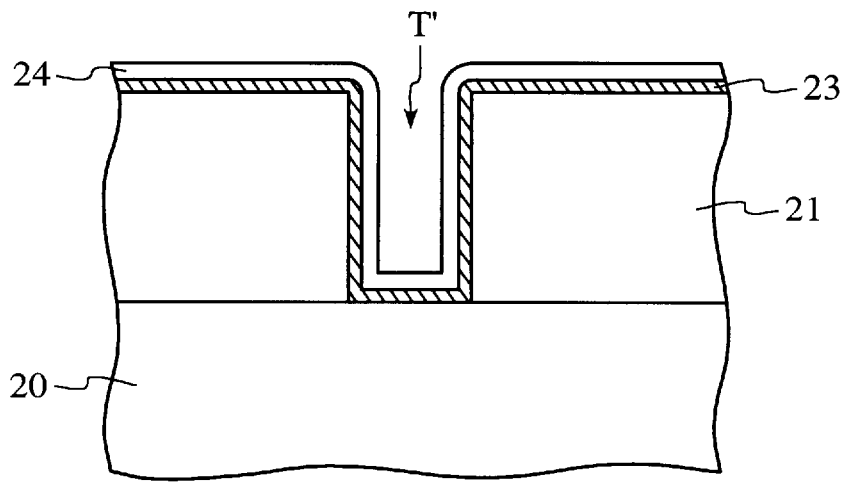

As illustrated in FIG. 2c, a first wiring layer in the form of a thin Al film is formed within contact hole T' and on barrier metal layer 23 by applying a chemical vapor deposition process. Under this condition, as an Al source for the chemical vapor deposition process, there may be used an organic metal (containing Al), such as DMAH (dimethyl aluminum), DEAH (diethyl aluminum hydride), TIBA (triisobutyl aluminum), or TMAA (trimethylamine alane). The process conditions may be a temperature of about 200°–400° C. and a pressure of about 100–1000 mTorr. Under such conditions, a film may be formed of a thickness of about 1000–2000 Angstroms. The thinner the film, the better the conventional clogging problem may be solved. Thus, even in the case where a thin film is formed by applying a chemical vapor deposition process, a spatially-continuous film may be formed.

In addition, a first metal layer can be formed through two rounds by applying a chemical vapor deposition process. In this case, first a thin film of about 1000–2000 Angstroms is formed with a power of about 1–10 KW at a pressure of about 1–20 mTorr and a temperature of over about 450° C. Then, a second thin film is formed with a power of about 10 KW at a pressure of about 1–20 mTorr and a temperature of about 450° C.

Figure 2D:
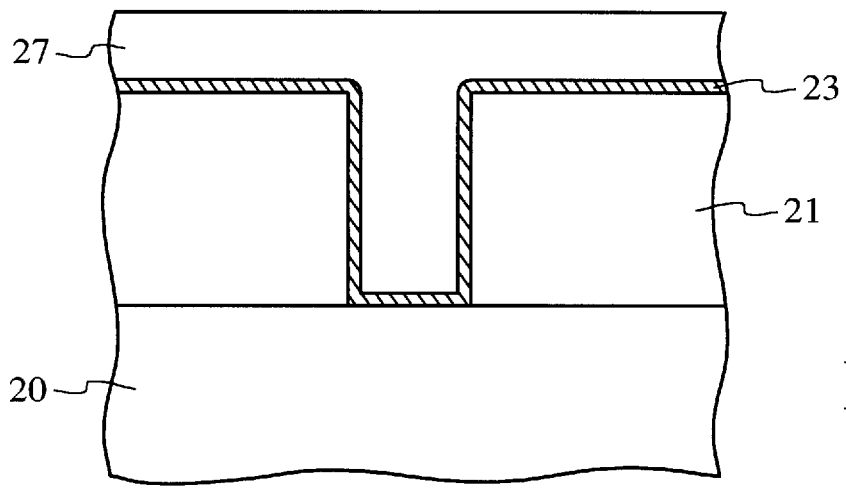

As illustrated in FIG. 2d, a high temperature is applied to improve the mobility of Al, and a second wiring metal layer is formed, thereby completing the formation of a final wiring metal layer 27.

Another embodiment of a method for forming a wiring metal layer according to the present invention may be carried out in the following manner. With this embodiment, the method may include the steps of: depositing an insulating layer on a semiconductor substrate on which elements have been formed, and defining a contact hole by applying a photo etching process; forming a barrier metal layer by depositing W, TiN or TiW on the insulating layer having the contact hole; forming a first wiring metal layer on the barrier metal by using a CVD-AL; forming a second wiring layer by sputtering Al on the first wiring metal layer at a low temperature; and carrying out an annealing at a high temperature to cause Al atoms of the second wiring metal layer to move into the contact hole, whereby a wiring metal layer for a semiconductor device is completed.

In this second embodiment, the process is same as the method of FIG. 2 up to the step of forming the first wiring metal layer. When forming the second wiring metal layer in the second embodiment, however, first the Al is sputtered at a low temperature to form an Al layer, and an annealing is carried out at a high temperature so as to fill the Al into the contact hole.

FIGS. 3a–3e are sectional views illustrating the second embodiment of the method for forming a wiring metal layer for a semiconductor device according to the present invention.

Figure 3A:
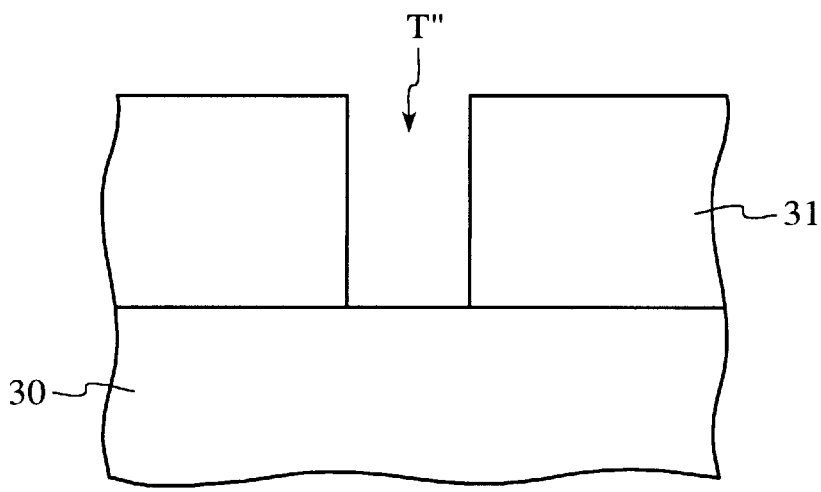
FIGS. 3a–3e illustrate another embodiment of a method for forming a wiring metal layer in a semiconductor according to the present invention.
Figure 3B:
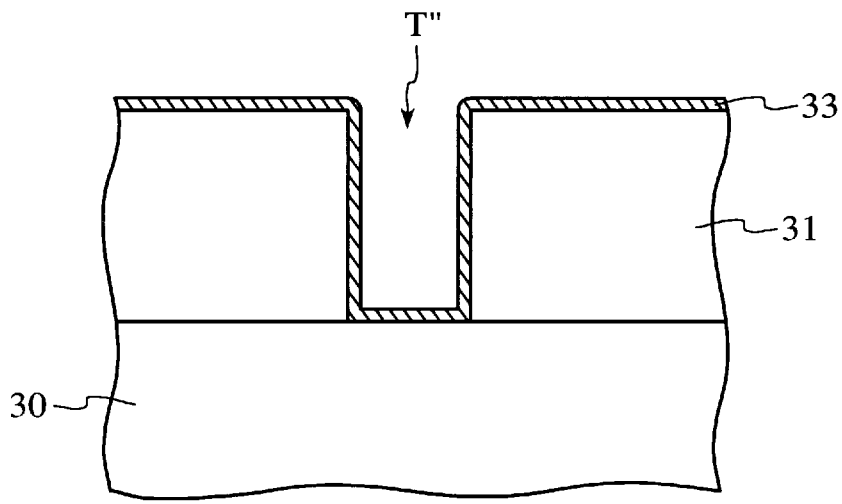

As illustrated in FIG. 3a, inter-layer dielectric 31 is formed upon semiconductor substrate 30 on which elements have been formed, and contact hole T" is formed in inter-layer dielectric 31. As. illustrated in FIG. 3b, barrier metal layer 33 is formed within the contact hole T" and on inter-layer dielectric 31. Barrier metal layer 33 may be composed of titanium (Ti), titanium nitride (TiN), titanium tungsten (TiW) or tungsten (W). After formation of barrier metal layer 33, an annealing is carried out to improve the characteristics of barrier metal layer 33.

Although not illustrated in the drawings, a thin film may be formed on barrier metal layer 33, so that the material of the thin film may react with the Al of the wiring metal layer. This may serve to improve the mobility of the Al during formation of the first metal layer. The material which is intended to react with the Al may include titanium (Ti), silicon (Si) and zinc (Zn).

Figure 3C:
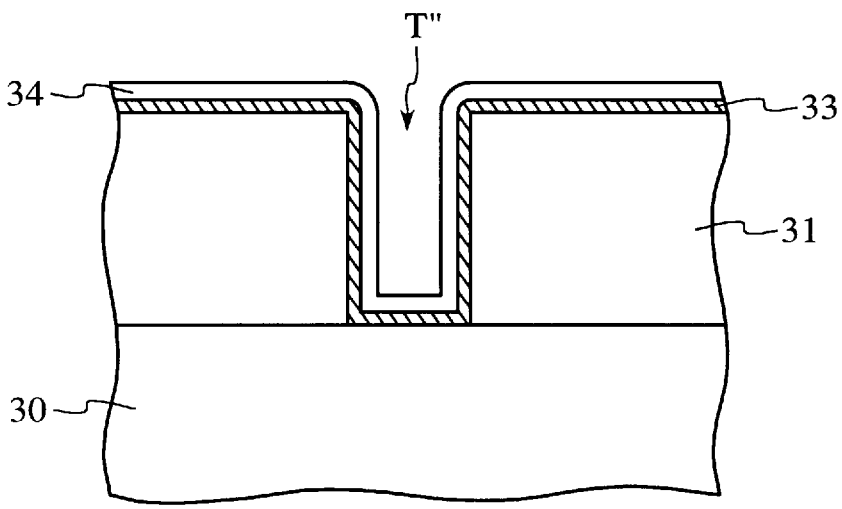

As illustrated in FIG. 3c, first wiring layer 34 in the form of a thin Al film is formed within contact hole T" and on barrier metal layer 33 by applying a chemical vapor deposition process. Under this condition, as an Al source for the chemical vapor deposition process, there may be used an organic metal (containing Al) such as DMAH (dimethyl aluminum), DEAH (diethyl aluminum hydride), TIBA (triisobutyl aluminum), or TMAA (trimethylamine alane). The process conditions may be a temperature of about 200°–400° C. and a pressure of about 100–1000 mTorr, and as a result a film with a thickness of about 1000–2000 Angstroms may be formed. The thinner the film, the better the conventional clogging problem may be solved. Thus, even in the case where a thin film is formed by applying a chemical vapor deposition process, a spatially-continuous film may be formed.

Figure 3D:
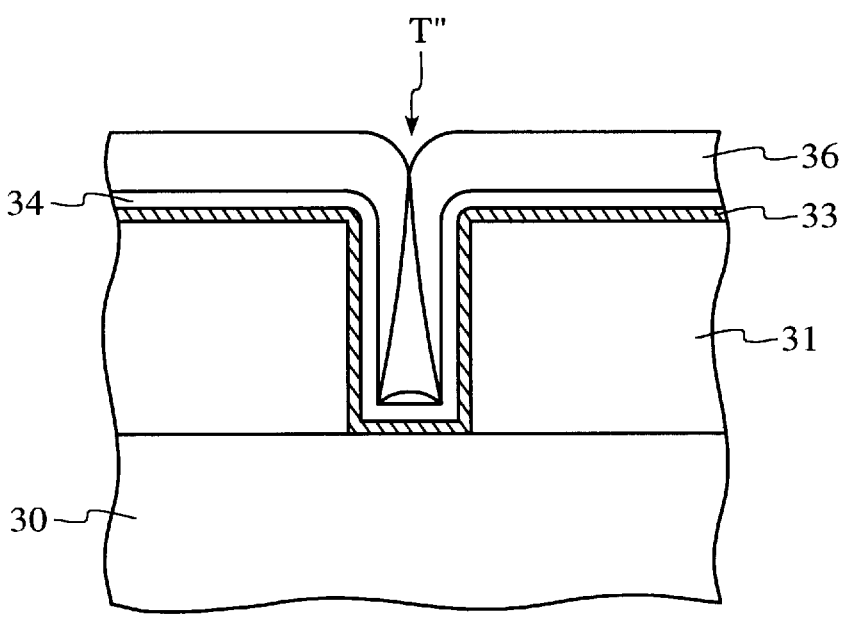
Figure 3E:
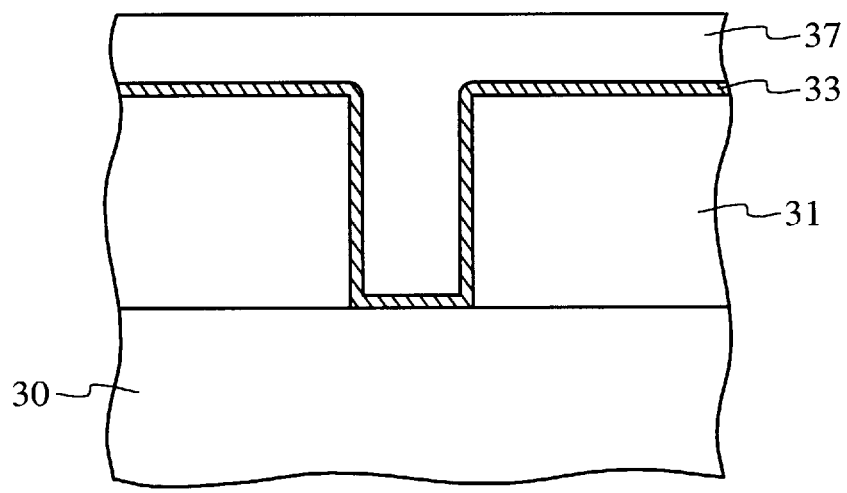

As illustrated in FIG. 3d, second metal layer 36 is formed by sputtering Al at a low temperature. As illustrated in FIG. 3e, second metal layer 36, which is formed by applying a sputtering process, is annealed at a high temperature, so that Al fills contact hole T", thereby obtaining final wiring metal layer 37.

Under this condition, the steps of FIGS. 3d and 3e may be repeated, taking into account the thickness of the wiring metal layer.

Further, at the step of FIG. 3d, a thin metallic film having a compressive stress may be deposited upon the second wiring metal layer, and then the step of FIG. 3e may be carried out, so that the mobility of the Al may be improved.

According to the present invention as described above, during formation of a VLSI scale device having a contact hole with a high aspect ratio, metal layers are filled into the contact hole without spatial discontinuities, and the first wiring metal deposition process may be carried out by applying a chemical vapor deposition process. Therefore, compared with the conventional method, even if a thin film of wiring metal is deposited, the wiring metal film may be deposited into the contact hole without spatial discontinuities. Consequently, the upper opening of the contact hole remains wide after the deposition of the first wiring metal (Al) layer, and, therefore, the wiring metal (Al) atoms easily move into the contact hole upon reaching the wafer during the second wiring metal (Al) deposition. As a result, superior Al filling characteristics may be obtained as compared with the conventional method. Further, the first wiring metal (Al)

deposition may be carried out within a short period of time as compared with the conventional method, and, therefore, the productivity may be improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for forming a wiring metal layer in a semiconductor device, comprising the steps of:

depositing an insulating layer upon a semiconductor substrate on which elements of the semiconductor device have been formed, and forming a contact hole in the insulating layer by a photo etching process;

forming a barrier metal layer upon the insulating layer and within the contact hole;

performing a chemical vapor deposition process to form a first wiring metal layer on the barrier metal layer; and depositing a second wiring metal layer with a sputtering method upon the first wiring metal layer, wherein the second wiring metal layer and the first wiring metal layer comprise the same material and contain aluminum.

2. The method of claim 1, wherein the step of forming a barrier metal layer comprises depositing a metallic material selected from the group of W, TiN or TiW.

3. The method of claim 1, wherein, after forming the barrier metal layer, the method further comprises the step of annealing the barrier metal layer.

4. The method of claim 1, wherein the barrier metal layer comprises a layer of barrier metal and a film of a material that is reactable with the first wiring metal layer to improve the mobility of atoms in the first wiring metal layer.

5. The method of claim 4, wherein the material reactable with the first wiring metal layer comprises a material selected from the group of Ti, Si, and Zn.

6. The method of claim 1, wherein an organo metallic precursor containing aluminum is used as a wiring metal source for the chemical vapor deposition process, wherein the organo metallic precursor is selected from the group of DMAH (dimethyl aluminum), DEAH (diethyl aluminum hydride), TIBA (triisobutyl aluminum), or TMAA (trimethylamine alane).

7. The method of claim 6, wherein the conditions for the chemical vapor deposition process are a temperature of about 200°–400° C. and a pressure of about 100–1000 mTorr, wherein the first wiring metal layer is formed to a thickness of about 1000–2000 Angstroms.

8. The method of claim 1, wherein the chemical vapor deposition process comprises forming a first film with a power of about 1–10 KW at a pressure of about 1–20 mTorr and a temperature over about 450° C., and forming a second film with a power of about 10 KW at a pressure of about 1–20 mTorr and a temperature over about 450° C.

9. A method for forming a wiring metal layer for a semiconductor device, comprising the steps of:

depositing an insulating layer on a semiconductor substrate on which elements of the semiconductor device have been formed, and forming a contact hole in the insulating layer by a photo etching process;

forming a barrier metal layer upon the insulating layer and within the contact hole;

forming a first wiring metal layer on the barrier metal by a chemical vapor deposition process;

forming a second wiring metal layer by sputtering metal on the first wiring metal layer to form the second wiring metal layer, wherein the second wiring metal layer and the first wiring metal layer comprise the same material and contain aluminum; and annealing the second wiring layer, wherein atoms of the second wiring metal layer move into the contact hole, wherein the wiring metal layer for the semiconductor device is formed.

10. The method of claim 9, wherein the step of forming a barrier metal layer comprises depositing a metallic material selected from the group of W, TiN or TiW.

11. The method of claim 9, wherein, after forming the barrier metal layer, the method further comprises the step of annealing the barrier metal layer.

12. The method of claim 9, wherein the barrier metal layer comprises a layer of barrier metal and a film of a material that is reactable with the first wiring metal layer to improve the mobility of atoms in the first wiring metal layer.

13. The method of claim 12, wherein the material reactable with the first wiring metal layer comprises a material selected from the group of Ti, Si and Zn.

14. The method of claim 9, wherein the step of forming the first and second metal wiring layers are performed a plurality of times.

15. The method of claim 9, wherein the annealing step is conducted at a temperature of over about 450° C.

* * * * *